United States Patent
Gatehouse

[11] Patent Number: 5,821,748
[45] Date of Patent: Oct. 13, 1998

[54] GRADIENT COILS IN MAGNETIC RESONANCE IMAGING MACHINES

[76] Inventor: Peter Gatehouse, 29 Warnham House, Sidmouth St., London WC1H8JP, United Kingdom

[21] Appl. No.: 779,018

[22] Filed: Jan. 6, 1997

[30] Foreign Application Priority Data

Jan. 5, 1996 [GB] United Kingdom .................... 9600147

[51] Int. Cl.⁶ ........................................................ G01V 3/00
[52] U.S. Cl. ............................................ 324/318; 324/322
[58] Field of Search .................................... 324/318, 322, 324/314, 306, 309, 300; 128/653.5

[56] References Cited

U.S. PATENT DOCUMENTS

| | | | |
|---|---|---|---|
| 5,384,537 | 1/1995 | Ito et al. ................................. | 324/300 |
| 5,427,102 | 6/1995 | Shimode et al. ........................ | 324/318 |
| 5,481,192 | 1/1996 | Mehlkopf et al. ...................... | 324/318 |
| 5,577,504 | 11/1996 | Salloway et al. ....................... | 324/318 |

*Primary Examiner*—Louis M. Arana
*Attorney, Agent, or Firm*—Watson Cole Griddle & Watson, PLLC

[57] ABSTRACT

In magnetic resonance imaging machines the gradient coils which generate fast changing magnetic fields vibrate and generate considerable levels of sound. In this invention the vibration of the gradient coils is utilized to generate sounds to communicate with a patient in the machine. The sounds may originate from an operator via a microphone, or may be computer generated.

6 Claims, 1 Drawing Sheet

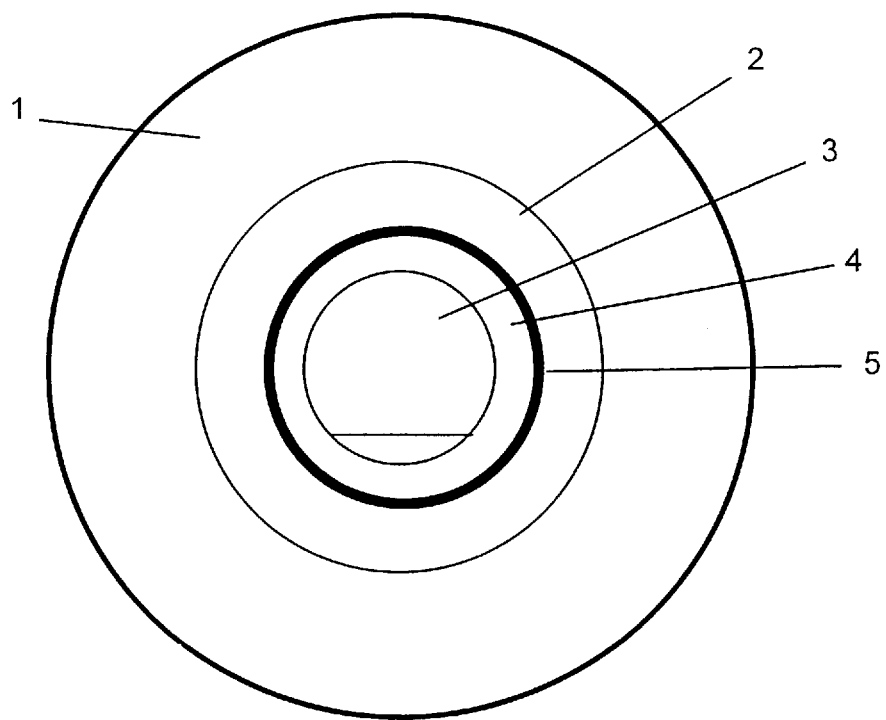
Fig. 1
Fig. 2
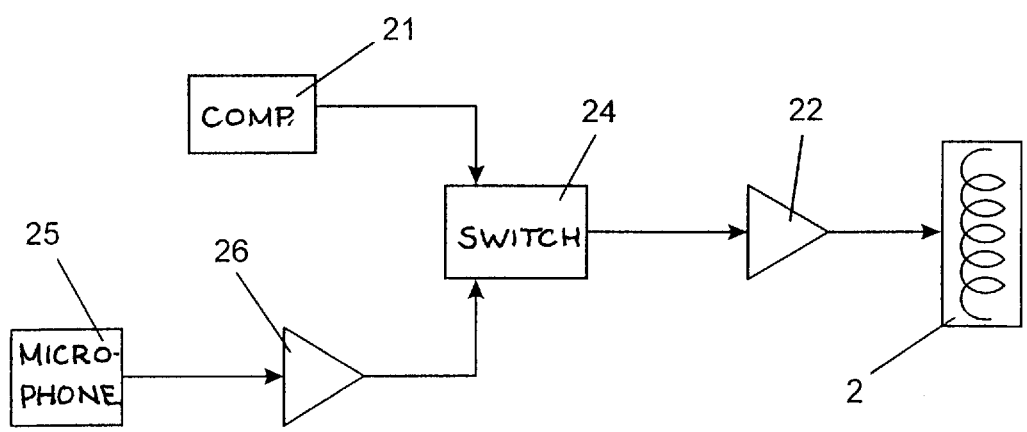

GRADIENT COILS IN MAGNETIC RESONANCE IMAGING MACHINES

BACKGROUND OF THE INVENTION

1. Field of the Invention

The present invention relates to the field of magnetic resonance imaging (MRI) using nuclear magnetic resonance (NMR). In particular the invention relates to the use of MRI for imaging a live patient and to reducing distress caused to such a patient during the imaging process.

This invention can be used in conjunction with one, some or all of the inventions described in our simultaneously filed applications entitled Magnetic Resonance Imaging of Fluid Flows, Phase Error Correction in Magnetic Resonance Imaging, Radio Frequency Coil Switching and Magnetic Field Measurement.

2. The Prior Art

The background to magnetic resonance imaging is well documented, for instance in "Principles of Magnetic Resonance" by D. B. Longnore, British Medical Bulletin (1989) vol. 45, no. 4, pages 848–880, but an understanding of the details of the operation of MRI is not necessary for the understanding of this invention. It is sufficient, in order to appreciate the present invention, to understand that MRI is conducted on a patient by placing the patient in a strong magnetic field and applying radio frequency energy to the patient.

The physical arrangement for this is typically for a patient lying down to be slid into a cylindrical opening in a large piece of apparatus which incorporates the various coils etc. for generating the required fields. In itself this can be an unnerving experience for a patient, but the overall experience can become more distressing due to the noise which is generated during the imaging process.

As part of the imaging process it is necessary to generate very quickly changing magnetic fields and these are generated by way of what are known as gradient coils. Because of the fast changing magnetic fields in these coils, the coils tend to vibrate. For this reason the coils are embedded in a strong potting compound in order to reduce the vibrations. This rigid mounting means that only a small proportion of the power supplied to the coils is dissipated as noise but due to the high energies involved and the proximity of the patient to the coils the noise generated by the vibrations is considerable and can be quite uncomfortable for the patient.

Another difficulty which is encountered during magnetic resonance imaging is that the operator of the apparatus may be positioned a considerable distance away from the patient during the imaging and therefore communication between the operator and the patient is difficult or impossible.

SUMMARY OF THE INVENTION

According to the present invention means is provided to cause the gradient coils in MRI apparatus to vibrate in such a way as to generate sounds communicating information to the patient.

The sound generated may simply be a quieter noise preceding the actual scan to act as a warning to the patient that the very loud noise is about to occur.

Alternatively the coils may be activated to synthesise a spoken warning to the patient, either based on a computer generated voice or to amplify the spoken words of an operator of the apparatus.

Clearly this additional communication cannot take place while the actual imaging is in process because the imaging dictates how the coils must be energised, but the use of the gradient coils in this manner makes the overall process less distressing for the patient.

The use of the already present gradient coils to communicate information as proposed in this invention has the advantage that it permits such communication without introducing additional electric conductors into the vicinity of the imaging volume. The most common problem with conductors in the imaging volume is that they may bring in noise and unwanted signals (for example, short-wave radio stations) at the frequency of the NMR signal, which degrades the quality of the images. The introduction of extra conductors for a separate patient intercom system could possibly affect the generated magnetic field thereby reducing the accuracy of the imaging process if such conductors were not carefully filtered before nearing the imaging volume.

DESCRIPTION OF THE DRAWINGS

FIG. 1 is a schematic cross-sectional illustration of the principal components of MRI scanning apparatus; and FIG. 2 is a block diagram of the main electric components relevant to this invention.

DESCRIPTION OF THE PEFERRED EMBODIMENT

MRI scanning apparatus is generally cylindrical in shape and is illustrated in cross-section in FIG. 1. The basic strong magnetic field is provided by a superconducting magnet 1 which is arranged to provide a very strong magnetic field in the region of the subject to be scanned. Typically this is achieved by providing a superconducting electro-magnet, having its windings immersed in liquid helium to maintain a very low temperature. Within the magnet 1 are located gradient coils indicated at 2. These gradient coils superimpose magnetic field gradients on the magnetic field generated by the magnet 1 so as to provide the varying fields required by the scanning process.

In the centre of the apparatus is the imaging volume 3 into which the subject, for instance the patient, is positioned during scanning. Surrounding this space are radio frequency (RF) transmitter coils shown by 4 which are used to generate the RF energy used in the imaging process. Resonances generated in the subject are received by RF receiver coils (not shown) which are typically positioned close to the patient. Finally, between the RF transmitter coils 4 and the gradient coils 2 is an RF shield 5. The purpose of this is to ensure that the subject under consideration and the RF coils are in an isolated RF environment, ie the only RF signals within the volume 3 are those generated by the transmitter coils 4 and induced in the subject under consideration and the signals do not leak out and interfere with the operation of the gradient coils.

The principal components of the apparatus associated with the energisation of the gradient coils are illustrated in the block diagram of FIG. 2, and comprise an NMR pulse sequence computer 21. This is arranged to generate the signals required to drive the gradient coils in order to conduct the imaging of a subject. The output from the computer 21 passes, via a high power amplifier 22, to the gradient coils 2. The gradient coils are, as explained above, located around an imaging volume in which a patient will be positioned for imaging.

The amplifier 22 typically has a constant gain from d.c. to approximately 5 kHz and is capable of delivering an average output power of approximately 500 W. As mentioned previously only a small proportion of this is dissipated as sound by the gradient coil.

It is to be understood that, while only one amplifier and set of gradient coils is illustrated in FIG. 2, there would usually be three present in an actual machine to provide magnetic field gradients in three dimensions. Any number of gradient coils, as many as may be required, may be used to generate sounds in accordance with this invention.

So far, what is illustrated comprises the usual components of an MRI system.

The preferred embodiment further comprises a switch 24 provided in the path between the computer 21 and amplifier 22. The switch has as inputs the output of computer 21 and a signal from microphone 25 via pre-amplifier 26. The switch selectively connects either the signal from computer 21 or the signal from microphone 25 to the amplifier 22.

Because of the high power of amplifier 22 the use simply of a microphone and pre-amplifier is sufficient to generate an audible reproduction of an operator's voice from the gradient coils.

Switch 24 may be a simple push switch which an operator can activate when communication with a patient is required. However the switch may alternatively be implemented in a form which prevents connection of the voice signal during imaging. This would prevent unintentional interruption of the imaging process.

The pulse sequence computer 21 is already capable of generating any desired waveform and thus can be used without modification to generate synthesised warning sounds, either synthesised voice messages or other warning noises. If such synthesised warning sounds are all that is required the switch 24, microphone 25 and pre-amplifier 26 may be dispensed with.

Therefore the present invention provides a means which has no effect on the imaging process itself and very little effect on the apparatus which needs to be provided, but which considerably increases the acceptability of the overall procedure to the patient.

I claim:

1. Magnetic resonance imaging apparatus comprising means defining an imaging volume into which a patient may be placed, magnetic field generating means arranged to generate magnetic fields in said imaging volume and which comprises at least one set of gradient field coils mounted in proximity to said imaging volume, electrical signal generating means arranged to generate electrical signals corresponding to desired energisations of said gradient coils and amplifying means arranged to amplify said electrical signals and apply the amplified signals to said gradient coils, the electrical signal generating means being arranged to generate electrical signals corresponding to desired sounds to be produced in said imaging volume whereby when said electrical signals are amplified and applied to said gradient coils, said gradient coils vibrate and produce said desired sounds in said imaging volume.

2. Apparatus according to claim 1 in which said electrical signal generating means comprises a microphone arranged to receive and generate electrical signals corresponding to an operator's voice.

3. Apparatus according to claim 1 in which said electrical signal generating means comprises a computing means arranged to generate electrical signals corresponding to desired sounds.

4. In magnetic resonance imaging apparatus which comprises means defining an imaging volume into which a patient may be placed and magnetic field generating means arranged to generate magnetic fields in said imaging volume and which comprises at least one set of gradient field coils mounted in proximity to said imaging volume, a method of producing desired sounds in said imaging volume comprising energising said gradient coils such that they vibrate whereby to generate said sounds.

5. A method according to claim 4 comprising providing a microphone arranged to receive and generate electrical signals corresponding to an operator's voice, amplifying said electrical signals and applying the amplified signals to said gradient coils whereby to reproduce said operator's voice in said imaging volume.

6. A method according to claim 4 comprising providing a computing means arranged to generate electrical signals corresponding to said desired sounds, amplifying said electrical signals and applying the amplified signals to said gradient coils whereby to reproduce said desired sounds in said imaging volume.

* * * * *

UNITED STATES PATENT AND TRADEMARK OFFICE
CERTIFICATE OF CORRECTION

PATENT NO. : 5,821,748

DATED : October 13, 1998

INVENTOR(S) : Peter GATEHOUSE

It is certified that error appears in the above-identified patent and that said Letters Patent is hereby corrected as shown below: On the title page, item:

[73] Assignee: Royal Brompton Hospital, London, United Kingdom

[56] References Cited
\* \* \*

Attorney, Agent, or Firm -- Watson Cole Grindle Watson, PLLC

Signed and Sealed this

Thirtieth Day of November, 1999

Attest:

Q. TODD DICKINSON

Attesting Officer

Acting Commissioner of Patents and Trademarks